(12) United States Patent
Clevenger et al.

(10) Patent No.: US 10,727,124 B2
(45) Date of Patent: Jul. 28, 2020

(54) STRUCTURE AND METHOD FOR FORMING FULLY-ALIGNED TRENCH WITH AN UP-VIA INTEGRATION SCHEME

(71) Applicant: International Business Machines Corporation, Armonk, NY (US)

(72) Inventors: Lawrence A. Clevenger, Saratoga Springs, NY (US); Nicholas Anthony Lanzillo, Troy, NY (US); Benjamin D. Briggs, Waterford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/173,327

(22) Filed: Oct. 29, 2018

(65) Prior Publication Data

US 2020/0135560 A1 Apr. 30, 2020

(51) Int. Cl.
| | |
|---|---|
| *H01L 21/768* | (2006.01) |
| *H01L 21/3105* | (2006.01) |
| *H01L 21/02* | (2006.01) |
| *H01L 23/522* | (2006.01) |
| *H01L 23/532* | (2006.01) |
| H01L 23/528 | (2006.01) |

(52) U.S. Cl.
CPC .. *H01L 21/76897* (2013.01); *H01L 21/02178* (2013.01); *H01L 21/31053* (2013.01); *H01L 21/76802* (2013.01); *H01L 21/76819* (2013.01); *H01L 21/76831* (2013.01); *H01L 21/76834* (2013.01); *H01L 21/76877* (2013.01); *H01L 23/5226* (2013.01); *H01L 23/53295* (2013.01); *H01L 23/528* (2013.01)

(58) Field of Classification Search
None
See application file for complete search history.

(56) References Cited

U.S. PATENT DOCUMENTS

| | | | | |
|---|---|---|---|---|
| 5,693,568 | A | * | 12/1997 | Liu ............ H01L 21/76897 |
| | | | | 438/618 |
| 6,372,633 | B1 | | 4/2002 | Maydan et al. |
| 9,391,019 | B2 | | 7/2016 | Kobrinsky et al. |
| 9,613,861 | B2 | | 4/2017 | Anderson et al. |
| 9,793,163 | B2 | | 10/2017 | Bristol et al. |
| 9,978,708 | B2 | | 5/2018 | Chen et al. |

(Continued)

*Primary Examiner* — Zandra V Smith
*Assistant Examiner* — Lawrence C Tynes, Jr.
(74) *Attorney, Agent, or Firm* — Vazken Alexanian; Ryan, Mason & Lewis, LLP

(57) ABSTRACT

A method for manufacturing a semiconductor device includes forming a conductive via extending vertically from a conductive layer, and depositing a first dielectric layer on the conductive layer and on lateral sides the conductive via. In the method, the conductive via is recessed with respect to a top surface of the first dielectric layer. An etch stop layer is deposited on the top surface of the first dielectric layer and on a top surface of the conductive via, and a second dielectric layer is deposited on the etch stop layer. The method also includes removing portions of the etch stop layer and the second dielectric layer to create a plurality of trenches spaced apart from each other. A trench of the plurality of trenches is formed over and exposes at least part of the conductive via, and a conductive material is deposited in the plurality of trenches.

20 Claims, 4 Drawing Sheets

(56) References Cited

U.S. PATENT DOCUMENTS

| | | | |
|---|---|---|---|
| 2008/0296730 A1* | 12/2008 | Nakao | H01L 23/5223 257/532 |
| 2015/0048488 A1* | 2/2015 | Peng | H01L 23/53295 257/637 |
| 2016/0111371 A1* | 4/2016 | Peng | H01L 23/53238 257/751 |
| 2017/0005069 A1* | 1/2017 | Chen | H01L 21/76898 |
| 2017/0271202 A1 | 9/2017 | Xu et al. | |
| 2018/0040510 A1 | 2/2018 | Briggs et al. | |
| 2019/0237366 A1 | 8/2019 | Yang et al. | |

* cited by examiner

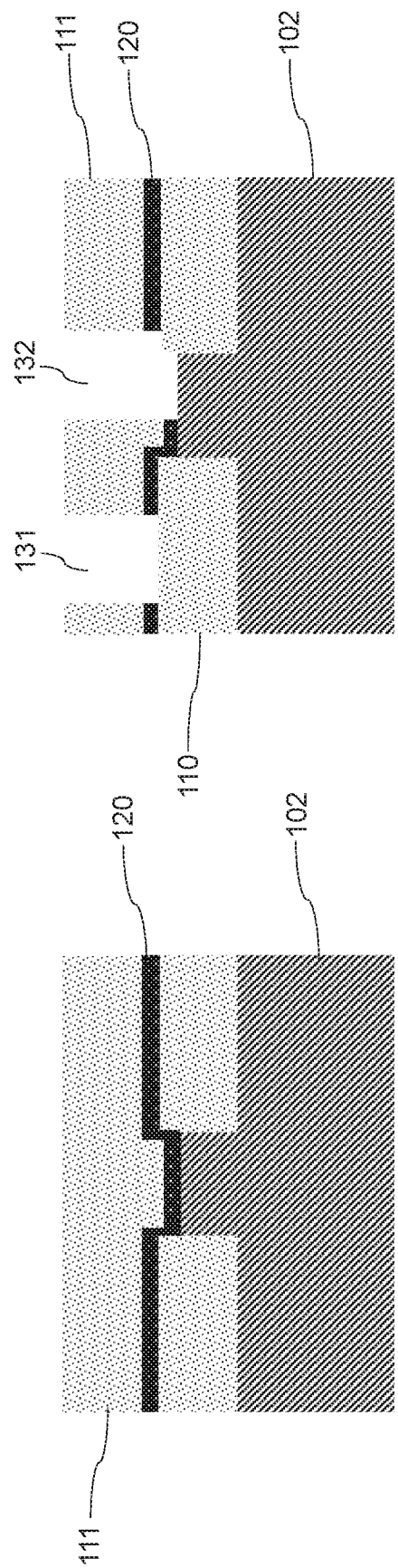

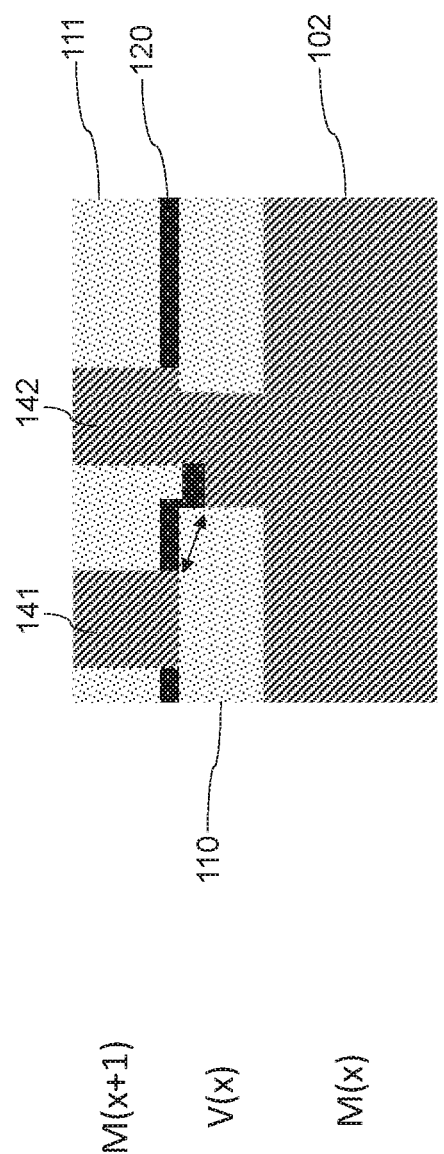

STRUCTURE AND METHOD FOR FORMING FULLY-ALIGNED TRENCH WITH AN UP-VIA INTEGRATION SCHEME

BACKGROUND

In general, vias are vertical metal interconnect pathways to electrically connect a first metal layer to a second metal layer in a semiconductor device. Very-Large Scale Integrated (VLSI) or Ultra-Large Scale Integrated (ULSI) circuits include interconnect structures where vias connect metal layers in different levels. Vias and metal layers (also referred to as wires) can be formed in a dual damascene process, where via openings and trenches are formed in a dielectric layer followed by deposition of the conductive metal materials to form the vias and metal layers.

Metal interconnects or vias that are fully aligned to a first metallization level (M(x)) and a second metallization level (M(x+1)) are referred to as fully aligned vias (FAVs). A fully aligned process increases the overlay margin along both axes (e.g., perpendicular and parallel to an interconnect line below). A self-aligned process increases the overlay margin along one axis, but not two. As component size decreases in VLSI and ULSI devices problems associated with small distances between conductive structures, such as, for example, increased line resistance, increased variations in via resistance and shorting, have been encountered.

Accordingly, there is a need for methods and structures for forming FAVs which address problems with isolation of the adjacent conductive structures.

SUMMARY

According to an exemplary embodiment of the present invention, a method for manufacturing a semiconductor device includes forming a conductive via extending vertically from a conductive layer, and depositing a first dielectric layer on the conductive layer and on lateral sides f the conductive via. In the method, the conductive via is recessed with respect to a top surface of the first dielectric layer. An etch stop layer is deposited on the top surface of the first dielectric layer and on a top surface of the conductive via, and a second dielectric layer is deposited on the etch stop layer. The method also includes removing portions of the etch stop layer and the second dielectric layer to create a plurality of trenches spaced apart from each other. A trench of the plurality of trenches is formed over and exposes at least part of the conductive via, and a conductive material is deposited in the plurality of trenches.

According to an exemplary embodiment of the present invention, a semiconductor device includes a conductive via extending vertically from a conductive layer, and a first dielectric layer disposed on the conductive layer and on lateral sides f the conductive via. The conductive via is recessed with respect to a top surface of the first dielectric layer. A second dielectric layer is disposed on the first dielectric layer, and a plurality of trenches are disposed in the second dielectric layer and spaced apart from each other. A trench of the plurality of trenches is formed over at least part of the conductive via, and a conductive material is disposed in the plurality of trenches.

According to an exemplary embodiment of the present invention, a method for manufacturing a semiconductor device includes forming, by a subtractive process, a conductive via extending vertically from a conductive layer of a first metallization level, and depositing a first dielectric layer on the conductive layer and on lateral sides of the conductive via. In the method, the conductive via is recessed with respect to a top surface of the first dielectric layer. An etch stop layer is deposited on the top surface of the first dielectric layer and on a top surface of the conductive via, and a second dielectric layer is deposited on the etch stop layer. The method also includes removing portions of the etch stop layer and the second dielectric layer to create a plurality of trenches spaced apart from each other. A trench of the plurality of trenches is formed over and exposes at least part of the conductive via, and a conductive material is deposited in the plurality of trenches. The etch stop layer, the second dielectric layer and the conductive material form at least part of a second metallization level.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 5 is a cross-sectional view illustrating fabrication of a semiconductor device at a BEOL or MOL, and showing dielectric deposition, according to an exemplary embodiment of the present invention.

FIG. 6 is a cross-sectional view illustrating fabrication of a semiconductor device at a BEOL or MOL, and showing trench formation, according to an exemplary embodiment of the present invention.

FIG. 7 is a cross-sectional view illustrating fabrication of a semiconductor device at a BEOL or MOL, and showing metal deposition, according to an exemplary embodiment of the present invention.

DETAILED DESCRIPTION

Figure 2:
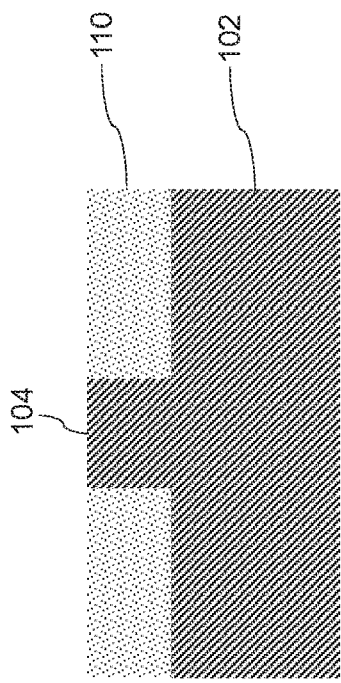
FIG. 2 is a cross-sectional view illustrating fabrication of a semiconductor device at a BEOL or MOL, and showing dielectric deposition and planarization, according to an exemplary embodiment of the present invention.

Exemplary embodiments of the invention will now be discussed in further detail with regard to semiconductor devices and methods of manufacturing same and, in particular, to the formation of an interconnect structure which maximizes spacing between vias and adjacent wires.

It is to be understood that the various layers and/or regions shown in the accompanying drawings are not drawn to scale, and that one or more layers and/or regions of a type commonly used in, for example, complementary metal-oxide semiconductor (CMOS), fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, CMOSs, MOSFETs and/or FinFETs. By way of non-limiting example, the semiconductor devices can include, but are not limited to CMOS, MOSFET and FinFET devices, and/or semiconductor devices that use CMOS, MOSFET and/or FinFET technology.

As used herein, "height" refers to a vertical size of an element (e.g., a layer, trench, hole, opening, etc.) in the cross-sectional views or images measured from a bottom surface to a top surface of the element, and/or measured with respect to a surface on which the element is located. Conversely, a "depth" refers to a vertical size of an element (e.g., a layer, trench, hole, opening, etc.) in the cross-sectional views or images measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawings or images. For example, as used herein, "vertical" refers to a direction perpendicular to the top surface of the substrate in the cross-sectional views or images, and "horizontal" refers to a direction parallel to the top surface of the substrate in the cross-sectional views or images.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, an "up-via" refers to a via structure that is formed subtractively from a damascene wire. More specifically, a portion of a conductive metal layer (e.g. damascene wire) is masked so that exposed portions of the conductive metal layer can be recessed to a certain depth by lithography and/or etching processes, leaving a vertically protruding portion (e.g., the remaining masked portion). The up-via vertically extends from a lower portion of the conductive metal layer, and is integral and self-aligned with the lower portion of the conductive layer (e.g., damascene wire).

Embodiments of the present invention provide methods and structures for forming FAVs which address problems with isolation of the adjacent conductive structures. According to an embodiment of the present invention, following recessing of a fully aligned via (FAV), an etch stop layer including, for example, aluminum nitride (AlN), is conformally deposited on the recessed FAV and an adjacent dielectric layer. The presence of the etch stop and the recessing of the FAV permit formation of a structure with an increased dielectric area separating the FAV from metallization line in an adjacent trench than in conventional structures.

In general, in a non-limiting illustrative example, via structures (e.g., up-vias) are formed in a subtractive process and recessed prior to metallization of a metallization level above the up-via. An etch stop layer is deposited conformally after the up-via recess and before dielectric deposition for the above metallization level. The etch stop layer prevents over-etching of the dielectric layer when forming trenches in the above metallization level for neighboring metal lines formed to sides of the up-via. In accordance with embodiments of the present invention, minimum spacing between a top of the up-via and a bottom of an adjacent trench for a neighboring metal line is maximized relative to the conventional art, which results in a lower line resistance and decreased variability of via resistance.

Figure 1:
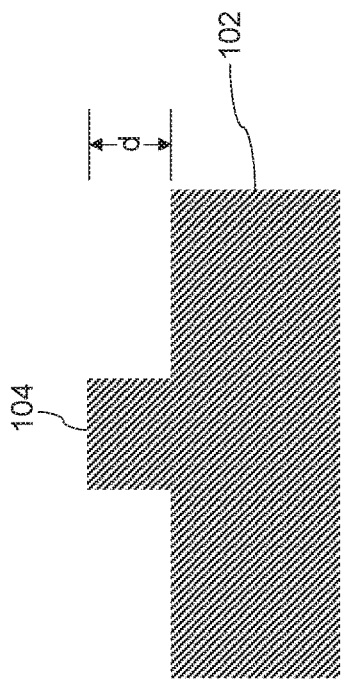
FIG. 1 is a cross-sectional view illustrating fabrication of a semiconductor device at a back-end-of-line (BEOL) or middle-of-line (MOL), and showing via formation, according to an exemplary embodiment of the present invention.

FIG. 1 is a cross-sectional view illustrating fabrication of a semiconductor device at a back-end-of-line (BEOL) or middle-of-line (MOL), and showing via formation, according to an exemplary embodiment of the present invention. Referring to FIG. 1, a via 104 (e.g., up-via) is formed by a subtractive process on a metal layer (e.g., wire) 102 in a metallization level (M(x)). The via 104 is subtractively formed from the metal layer 102, by masking a portion of the metal layer 102 and recessing exposed portions of the metal layer to a depth d by lithography and/or etching processes, leaving a vertically protruding via 104. The via 104 vertically extends from the metal layer 102, and is integral and self-aligned with the metal layer 102. According to a non-limiting embodiment, a vertical height of the via 104 is in the range of about 10 nm to about 100 nm. The via 104 and metal layer 102 comprise the same electrically conductive material, such as, for example, copper (Cu), nickel (Ni), cobalt (Co), iron (Fe), gold (Au), silver (Ag), ruthenium (Ru), palladium (Pd), platinum (Pt), iridium (Ir), tungsten (W), and any mixtures or alloys thereof.

According to an embodiment, the via 104 and metal layer 102 are part of a BEOL or MOL interconnect structure of an integrated circuit where devices, including, but not limited to, transistors, capacitors, and resistors are interconnected with metal layers (e.g., wiring) on a wafer. The metal layer 102 can be part of metallization level M(x) comprising a dielectric layer (not shown) formed around the metal layer 102, and other metal layers (not shown) in the dielectric layer. A via level V(x) similarly can comprise other vias integrated with other metal layers of the metallization level M(x).

As can be understood by one of ordinary skill in the art, the metallization level M(x) can be on a semiconductor substrate (not shown), with intervening layers between the metallization level M(x) and the substrate. A semiconductor substrate can be, for example, a bulk substrate or a silicon-on-insulator (SOI) substrate including a buried insulating layer, such as, for example, a buried oxide or nitride layer located on an upper surface of the semiconductor substrate. The substrate may comprise semiconductor material including, but not limited to, Si, SiGe, SiC, SiGeC or other like semiconductor. In addition, multiple layers of the semiconductor materials can be used as the semiconductor material of the substrate. A plurality of devices can be on the substrate, such as, for example, transistors, capacitors, and resistors.

FIG. 2 is a cross-sectional view illustrating fabrication of a semiconductor device at a BEOL or MOL, and showing dielectric deposition and planarization, according to an exemplary embodiment of the present invention. Referring to FIG. 2, a dielectric layer 110 is deposited on the via 104 and metal layer 102. The dielectric layer 110 is then planarized to be level or substantially level with a top surface of the via 104, using, for example, chemical mechanical polishing (CMP). As a result of the CMP, a top surface of the via 104 is exposed. The dielectric layer 110 comprises, but is not necessarily limited to, silicon dioxide ($SiO_2$), carbon-doped silicon oxide (SiCOH), SiLK® dielectrics, and porous forms of these low-k dielectric films.

Deposition of the dielectric 110 is performed using, for example, chemical vapor deposition (CVD), plasma enhanced CVD (PECVD), radio-frequency CVD (RFCVD), physical vapor deposition (PVD), ALD, molecular layer deposition (MLD), molecular beam deposition (MBD), pulsed laser deposition (PLD), or liquid source misted chemical deposition (LSMCD).

Figure 3:
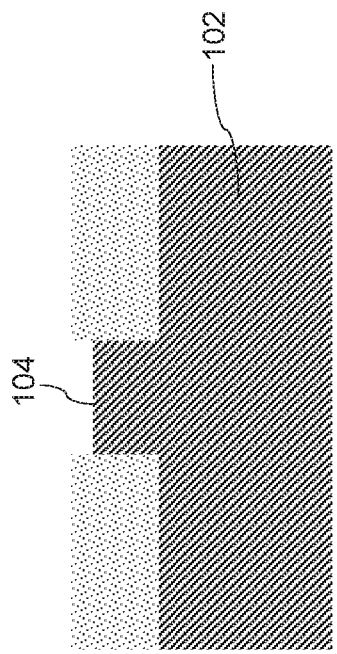
FIG. 3 is a cross-sectional view illustrating fabrication of a semiconductor device at a BEOL or MOL, and showing recessing of a via, according to an exemplary embodiment of the present invention.

FIG. 3 is a cross-sectional view illustrating fabrication of a semiconductor device at a BEOL or MOL, and showing recessing of a via, according to an exemplary embodiment of the present invention. Referring to FIG. 3, the via 104 is selectively recessed to a height below the top surface of the dielectric layer 110 using a wet chemistry including, for example, alanine or a RIE process using, for example, alanine. According to an embodiment of the present invention, a depth of the recess (i.e., distance below the top surface of the dielectric layer 110) is about 5 nm-about 10 nm.

Figure 4:
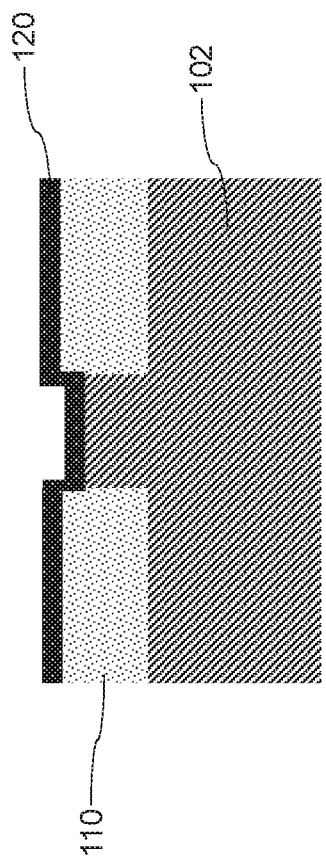
FIG. 4 is a cross-sectional view illustrating fabrication of a semiconductor device at a BEOL or MOL, and showing conformal etch stop layer deposition, according to an exemplary embodiment of the present invention.

FIG. 4 is a cross-sectional view illustrating fabrication of a semiconductor device at a BEOL or MOL, and showing conformal etch stop layer deposition, according to an exemplary embodiment of the present invention. Referring to FIG. 4, an etch stop layer 120 is conformally deposited on the dielectric layer 110 and on the recessed via 104 using a conformal deposition process such as, for example, ALD. In accordance with an embodiment of the present invention, a thickness (e.g., vertical height) of the etch stop layer 120 can be in the range of about 2 angstroms to about 15 nm, and comprises, but is not necessarily limited to, aluminum nitride (AlN). As explained further herein, the etch stop layer 120 prevents over-etching of a subsequently deposited dielectric layer 111 (see FIGS. 5 and 6) when forming a trench 131 in the above metallization level M(x+1) for a neighboring metal line formed to the side of the via 104.

FIG. 5 is a cross-sectional view illustrating fabrication of a semiconductor device at a BEOL or MOL, and showing dielectric deposition, according to an exemplary embodiment of the present invention. Referring to FIG. 5, a dielectric layer 111 for a metallization level M(x+1) is deposited on the etch stop layer 120. The dielectric layer 111 comprises, but is not necessarily limited to, $SiO_2$, SiCOH, SiLK® dielectrics, and porous forms of these low-k dielectric films. Deposition of the dielectric 111 is performed using, for example, CVD, PECVD, RFCVD, PVD, ALD, MLD, MBD, PLD, or LSMCD.

FIG. 6 is a cross-sectional view illustrating fabrication of a semiconductor device at a BEOL or MOL, and showing trench formation, according to an exemplary embodiment of the present invention. Referring to FIG. 6, trenches 131 and 132 are formed in the dielectric layer 111. The trenches 131 and 132 are defined using, for example, lithography, RIE and wet etch techniques to open the trenches 131 and 132. For example, portions of the dielectric layer 111 can be covered with, for example, a mask, while exposed portions are etched down to the etch stop layer 120 using, for example, alanine, so that the etch stop layer 120 in the trenches 131 and 132 can be exposed. Then, the etch stop layer 120 at the bottom portions of each trench 131 and 132 is etched using a wet chemistry, including, for example, alanine. As can be understood, the presence of the etch stop layer 120 prevents the trench 131 from being etched deeper while etching of the dielectric 111 in the trench 132 continues until reaching the etch stop layer 120 on the recessed via 104 in the trench 132. Due to the recessed via 104, a portion of the etch stop layer 120 in the trench 132 is at a deeper position than the etch stop layer 120 in the trench 131, and the portion of dielectric layer 111 over the recessed via 104 in the trench 132 extends to a greater depth than the dielectric 111 in the trench 131. As a result of the trench formation, part of the top surface of the recessed via 104 in the trench 132 is exposed, and part of the dielectric layer 110 in the trench 131 is exposed.

FIG. 7 is a cross-sectional view illustrating fabrication of a semiconductor device at a BEOL or MOL, and showing metal deposition, according to an exemplary embodiment of the present invention. Referring to FIG. 7, electrically conductive layers 141 and 142 including, for example, Cu, Ni, Co, Fe, Au, Ag, Ru, Pd, Pt, Ir, W and any mixtures or alloys thereof are deposited in trenches 131 and 132 on the exposed dielectric layer 110 and/or the exposed via 104. The layers 141 and 142 are formed by depositing a conductive material using deposition techniques, including, but not necessarily limited to, electroplating, electroless plating, CVD and PVD techniques. The conductive material fills in the trenches 131 and 132 to form the conductive layers 141 and 142. To the extent that the conductive material is at a height above the top surface of the dielectric 111 after deposition, excess portions of the conductive material formed on the top surface of the dielectric 111 can be polished off, using for example, a CMP process to planarize the top surface and result in structure shown in FIG. 7.

As shown by the arrow in FIG. 7, the recessing of the via 104 increases the distance between the top left edge of the via 104 and the bottom right edge of the conductive layer 141 to a greater distance than if the top surface of the via was planar or substantially planar with a bottom surface of the conductive layer 141. According to an embodiment of the present invention, a top surface of the via 104 is at a lower vertical height than a bottom surface of the conductive layer 141 formed in the neighboring (e.g., adjacent) trench 131.

As illustrated in FIGS. 6 and 7, the trench 132 exposes a portion of the top surface of the recessed via 104, such that the adjacent unexposed portion of the recessed via 104 (e.g., adjacent to the side of the trench 132) is under a stepped portion of the etch stop layer 120 formed as a result of different heights of the dielectric layer 110 and the via 104. The trench 132 also exposes a portion of a top surface of the dielectric layer 110 having a greater height than the top surface of the recessed via 104.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
    forming a conductive via extending vertically from a conductive layer;
    depositing a first dielectric layer on the conductive layer and on lateral sides of the conductive via;
    recessing the conductive via with respect to a top surface of the first dielectric layer;
    depositing an etch stop layer on the top surface of the first dielectric layer and on a top surface of the conductive via;
    depositing a second dielectric layer on the etch stop layer;
    removing portions of the etch stop layer and the second dielectric layer to create a plurality of trenches spaced apart from each other, wherein a trench of the plurality of trenches is formed over and exposes at least part of the conductive via; and
    depositing a conductive material in the plurality of trenches;
    wherein the top surface of the conductive via is at a lower height than the bottommost surface of the conductive material formed in an adjacent trench of the plurality of trenches; and
    wherein following the removing of the portions of the etch stop layer, a bottom surface of a remaining portion of the etch stop layer is on part of the top surface of the conductive via at the lower height.

2. The method according to claim 1, wherein the conductive via is formed by a subtractive process.

3. The method according to claim 1, wherein the conductive via is integral and self-aligned with the conductive layer.

4. The method according to claim 1, further comprising:
    depositing the first dielectric layer on the top surface of the conductive layer; and
    planarizing the first dielectric layer to expose the top surface of the conductive via.

5. The method according to claim 1, wherein the etch stop layer comprises aluminum nitride.

6. The method according to claim 1, wherein the etch stop layer is conformally deposited on the top surface of the first dielectric layer and on the top surface of the conductive via.

7. The method according to claim 1, wherein the removing of the portions of the etch stop layer and the second dielectric layer to create a plurality of trenches comprises performing a first etching process to remove the portions of the second dielectric layer and performing a second etching process to remove the portions of the etch stop layer.

8. The method according to claim 1, wherein an unexposed portion of the conductive via adjacent the trench is under part of the etch stop layer.

9. The method according to claim 8, wherein the part of the etch stop layer is a stepped portion of the etch stop layer.

10. The method according to claim 1, wherein a bottommost portion of the trench formed over and exposing at least part of the conductive via is at a lower height than a bottommost portion of the adjacent trench of the plurality of trenches.

11. A semiconductor device, comprising:
    a conductive via extending vertically from a conductive layer;
    a first dielectric layer disposed on the conductive layer and on lateral sides of the conductive via;
    wherein the conductive via is recessed with respect to a top surface of the first dielectric layer;
    a second dielectric layer disposed on the first dielectric layer;
    a plurality of trenches disposed in the second dielectric layer and spaced apart from each other, wherein a trench of the plurality of trenches is formed over at least part of the conductive via;
    a conductive material disposed in the plurality of trenches;
    wherein a top surface of the conductive via is at a lower height than the bottommost surface of the conductive material formed in an adjacent trench of the plurality of trenches; and
    an etch stop layer comprising a portion disposed on part of the top surface of the conductive via at the lower height;
    wherein a bottom surface of the portion of the etch stop layer is on the part of the top surface of the conductive via at the lower height.

12. The semiconductor device according to claim 11, wherein the conductive via is integral and self-aligned with the conductive layer.

13. The semiconductor device according to claim 11, wherein another portion of the etch stop layer is disposed between the first and second dielectric layers.

14. The semiconductor device according to claim 13, wherein the etch stop layer comprises aluminum nitride.

15. The semiconductor device according to claim 13, wherein the part of top surface of the conductive via is adjacent the trench and is under the bottom surface of the portion of the etch stop layer.

16. The semiconductor device according to claim 15, wherein the portion of the etch stop layer comprises a stepped configuration.

17. The semiconductor device according to claim 11, wherein a bottommost portion of the trench formed over at least part of the conductive via is at a lower height than a bottommost portion of the adjacent trench of the plurality of trenches.

18. A method for manufacturing a semiconductor device, comprising:
    forming, by a subtractive process, a conductive via extending vertically from a conductive layer of a first metallization level;
    depositing a first dielectric layer on the conductive layer and on lateral sides of the conductive via;
    recessing the conductive via with respect to a top surface of the first dielectric layer;
    depositing an etch stop layer on the top surface of the first dielectric layer and on a top surface of the conductive via;
    depositing a second dielectric layer on the etch stop layer;
    removing portions of the etch stop layer and the second dielectric layer to create a plurality of trenches spaced apart from each other, wherein a trench of the plurality of trenches is formed over and exposes at least part of the conductive via; and depositing a conductive material in the plurality of trenches;

wherein the top surface of the conductive via is at a lower height than the bottommost surface of the conductive material formed in an adjacent trench of the plurality of trenches;

wherein following the removing of the portions of the etch stop layer, a bottom surface of a remaining portion of the etch stop layer is on part of the top surface of the conductive via at the lower height; and wherein the etch stop layer, the second dielectric layer and the conductive material form at least part of a second metallization level.

19. The method according to claim 18, wherein the conductive via is integral and self-aligned with the conductive layer.

20. The method according to claim 18, wherein a bottommost portion of the trench formed over and exposing at least part of the conductive via is at a lower height than a bottommost portion of the adjacent trench of the plurality of trenches.

* * * * *